United States Patent [19]

Weiss

[11] Patent Number: 5,151,922
[45] Date of Patent: Sep. 29, 1992

[54] VARIABLE SPEAKER MUTING BASED ON RECEIVED DATA

[75] Inventor: Karl R. Weiss, Sunrise, Fla.

[73] Assignee: Motorola, Inc., Schaumburg, Ill.

[21] Appl. No.: 586,667

[22] Filed: Sep. 24, 1990

[51] Int. Cl.⁵ .......................................... H04L 25/00
[52] U.S. Cl. ................................. 375/5; 375/104
[58] Field of Search ............... 375/5, 104; 455/225, 455/212, 213, 222, 223, 224, 303; 381/94, 104

[56] References Cited

U.S. PATENT DOCUMENTS

| | | | |
|---|---|---|---|
| 3,603,884 | 6/1969 | Zaura, Jr. | 375/104 |
| 3,927,376 | 12/1975 | Ferrie | 375/5 |
| 3,939,431 | 2/1976 | Cohlman | 455/223 |
| 4,423,416 | 12/1983 | Bailey et al. | 375/5 |
| 4,430,742 | 2/1984 | Milleker et al. | 375/5 |
| 4,431,991 | 2/1984 | Bailey et al. | 375/5 |
| 4,554,665 | 2/1990 | Beesley | 371/55 |
| 4,663,765 | 5/1987 | Sutphin et al. | 375/5 |
| 4,704,736 | 11/1987 | Kasser | 375/104 |
| 4,972,510 | 11/1990 | Guizerix et al. | 375/104 |

FOREIGN PATENT DOCUMENTS

| | | | |
|---|---|---|---|
| 0171240 | 9/1984 | Japan | 375/5 |
| 0003231 | 1/1985 | Japan | 375/5 |

*Primary Examiner*—Stephen Chin
*Attorney, Agent, or Firm*—Daniel K. Nichols; Juliana Agon

[57] ABSTRACT

A method and an apparatus for controlling a speaker mute time is provided to transmit an information message from a first communication device to a second communication device. In response to receiving the information message, the second communication device controls the duration of its speaker mute time.

12 Claims, 3 Drawing Sheets

VARIABLE SPEAKER MUTING BASED ON RECEIVED DATA

TECHNICAL FIELD

This invention relates generally to speaker muting techniques in voice communications systems and more particularly to an intelligent speaker muting method and apparatus that is particularly well adapted for use in radio communications systems.

BACKGROUND

Current radios function in channel environments that may contain data, clear voice, and coded or encrypted voice transmissions. For each one of these types of transmissions there is an associated attack time (i.e. the data detector takes a certain amount of time to detect) at the receiving subscriber unit. The coded voice detector may take some time to detect encrypted voice which may require more time than for clear voice to be detected.

Conventionally, the receiving subscriber unit cannot tell which type of signal will be received next. Currently, in receivers of a voice communication systems data muting typically has been accomplished by detecting a presence of a data signal and then muting the output of the receiver so that it is not heard, regardless of the following signal. As described in U.S. Pat. No. 4,430,742 and hereby incorporated by reference, the data muting is terminated whenever the last bit of the data signal has been detected (prior art #2 as seen in FIGS. 2A-C). Many different techniques exist for detecting the presence of the data signal such as detection of a word sync (as illustrated in U.S. Pat. No. 4,430,742) or in some improved methods, the detection of a bit sync (as illustrated by prior art #2 as seen in FIGS. 2A-C as another example). In addition, a timer is also used to mute the speaker for some time period (prior art #1 illustrated in FIGS. 2A-C) starting from the reception of a carrier signal and ending when data has been detected.

However, since techniques of data muting requires the reception of several bits in order to detect a data signal (attack time), a short data burst is heard by the listener with the exception of the data received in the first data packet (as covered by prior art #1 of FIGS. 2A-C). Since the peak to peak signal level of the data signal is very high for reliability reasons, the data bursts are very loud during peak periods of data traffic in such communication systems. These data bursts are then very annoying to the listener.

In the case of coded voice transmissions, there is also associated with it an attack time to decrypt the coded voice signal which results in another short data burst, which is again passed to a listener. The effect of this data burst or squelch head can be removed by muting the output of the receiver (setting a fixed speaker mute delay) for a fixed time period that is long enough to include the decryption of the coded voice signal. The fixed time period would be set after a received data packet or at the beginning of the received signal (prior art #1 of FIGS. 2A-C). This method can also mute the data bursts caused by the attack time of multiple data packets as described previously.

However, the problem with this fixed period method is that the delay has to be set at the maximum attack time for the various transmission signals. If a clear voice signal is sent instead, this fixed delay might cut off the beginning of the clear voice transmission after a data packet. Since the fixed time period must be made long enough to accommodate system delays and the longest attack time, clear voice communications having a shorter attack time and following the data signal will also be muted.

Therefore, there is a long felt need for a data muting method and apparatus that mutes the entire data signal along with unwanted data bursts without muting the following voice communications.

SUMMARY OF THE INVENTION

Accordingly, it is an object of the present invention to transmit information that indicates which type of signal is to follow (clear voice, coded voice, or data) such that the receiving subscriber unit can substantially mute all of the unwanted data bursts and allow the maximum amount of voice data to be retained.

Briefly, according to the invention, a method and an apparatus for controlling a speaker mute time is provided to transmit an information message from a first communication device to a second communication device. In response to receiving the information message, the second communication device controls the duration of its speaker mute time.

DETAILED DESCRIPTION OF THE PREFERRED EMBODIMENT

Figure 1:
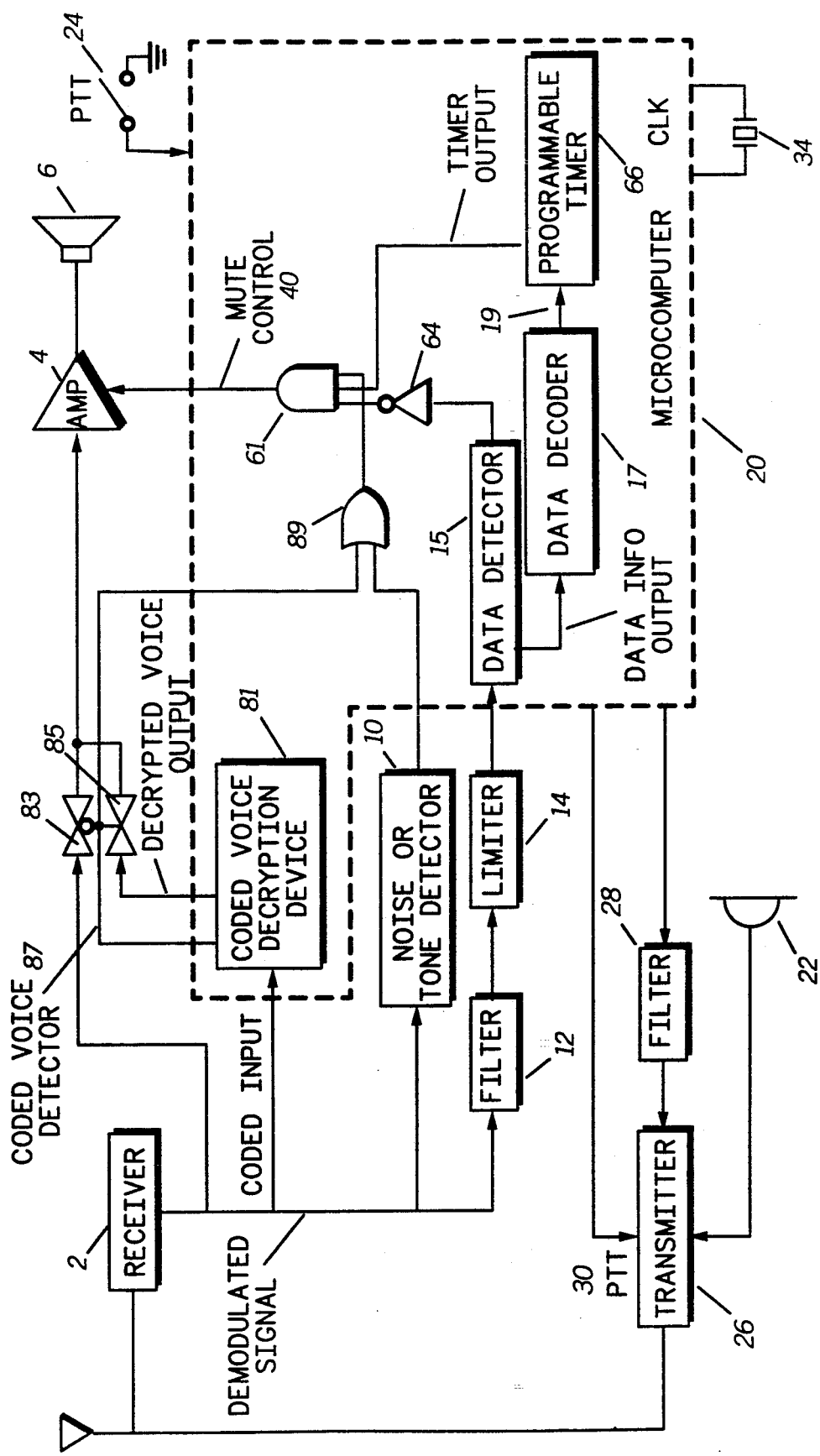
FIG. 1 is a block diagram of a mobile or portable radio in accordance with the present invention.

Referring to FIG. 1, there is illustrated a block diagram of a mobile or portable radio that may communicate with another mobile or portable radio or with a central station. As used herein, the term subscriber units or communication device collectively refers to portable units, mobile units or control (central) stations. Subscriber units, therefore, may be mobile units, portable units, or control (central) stations. Generally, a portable subscriber unit is designed to be carried on or about the person, a mobile subscriber unit is designed to be mounted into vehicles, and control stations are permanent or semi-permanent installations installed in buildings or other fixed locations.

The subscriber unit employs the data muting apparatus of the present invention. The radio includes a microcomputer or microprocessor 20 which may be a suitable conventional microcomputer, such as for example a Motorola type 68HC11 or its equivalent, for controlling the operation of a receiver 2 and a transmitter 26. As illustrated, the microcomputer may include a coded voice decryption device 81, a data detector 15, a data decoder 17, a programmable timer 66, and associated mute control logic circuitry (an AND gate 61, an inverting gate 64, and an OR gate 89) which may all be implemented by software. The frequency of operation of the microcomputer 20 is determined by a crystal 34.

In subscriber units, voice communications are provided by means of a speaker 6 and a microphone 22. Whenever a subscriber wishes to speak to another subscriber or a dispatcher at the central station a push-to-talk (PTT) switch 24 is activated. The microcomputer 20 senses the activation of the PTT switch 24 and correspondingly enables the transmitter 26 by means of a PTT signal 30 and serially couples successive bits of a data signal to a filter 28 for application to the transmitter 26. The data signals transmitted between the central station and a mobile or portable radio or between the radios themselves include a bit sync portion, a synchronization word, and an information word. According to the invention, the information word may include commands and/or status information to control the duration of the speaker mute time by way of the programmable timer 66.

The data signal transmitted by the microcomputer 20 also indicates to a receiving subscriber unit or a dispatcher at the central station that a particular mobile or portable radio desires to communicate with the dispatcher or another receiving subscriber unit.

In the receiving end, the demodulated signal from the receiver 2 is coupled to a filter 12 and a limiter 14 for providing a signal which is coupled to the data detector 15 to generate a first output as a data information output and a second output which indicates the presence or absence of a data signal. The digital signal which indicates the absence or presence of a data signal from the data detector 15 is coupled by way of the inverting gate 64 to a first input of the AND gate 61 to mute a speaker 6 while the data signal is present. The muting is accomplished by means of a mute control signal 40 (output of the AND gate 61) which disables an audio amplifier 4 unless all of the inputs to the AND gate 61 are high.

The data information output, from the data detector 15 is coupled to the data decoder 17 for recovering at least the information word which contains information associated with the type of signal following the data signal. The bit sync portion allows the receiver 2 to attain clock synchronization. The synchronization word may consist of any suitable correlatable bit pattern. The information word may have a variable number of bits to form an information field which includes commands and/or status information such as a command to fix the time delay or status information to say which type of signal is following the data signal. The information word may be arranged in any suitable format.

The data decoder 17 can thus decode the status included in the information word denoting that a data signal is following the present data signal as one time variable to be set (19) in the active low programmable timer 66. Similarly, the status of a clear voice signal following the present data signal will be decoded by the data decoder 17 to set a different time interval in the programmable timer 66 if necessary. The status of a coded voice signal following the present data signal as decoded in the data decoder 17 will result in a longer time interval than the clear voice interval to mute the speaker during decryption of the voice signal. Instead of status information, the information field of the information word can actually provide the information to program the programmable timer 66 for the particular time interval. Only three different time intervals are provided in this embodiment, but less or more intervals may be provided as necessary.

The signal from the data decoder 17 is coupled to the trigger input of the programmable timer 66. The active low output of the timer 66 (See waveform 210 in FIGS. 2A–C) is triggered by the content of the received data signal and is coupled to a second input of the AND gate 61 for causing the mute control signal 40 to have a zero state for a variable or programmable time interval (set by the timer 66 based on the content of the information word which relates to the type of signal following the information word). After the time interval or delay provided by the output of the timer 66, the mute control signal 40 (output of the AND gate 61) will change state to a binary one state (as long as the other inputs are high) for enabling the received signal path. Thus, the received signal path is always muted for at least the time duration of the output of the timer 66.

The voice portion of the demodulated signal from the receiver 2 is coupled to the audio amplifier 4 by way of either one of two digitally controlled analog gates 83 or 85, depending on whether the voice is coded as detected by a coded voice detector 87. If coded voice is present, the coded voice is coupled to the coded voice decryption device 81. The decrypted voice output from the coded voice decryption device 81 is coupled to the audio amplifier 4 by the gate 85 enabled by the coded voice detector 87 which also disables the gate 83 at the same time. If a clear voice is present instead, the absence of the encryption enables the inverted analog gate 83 to pass through the clear voice from the receiver 2 into the audio amplifier 4.

The demodulated output of the receiver 2 is also coupled to a noise or tone detector 10 which provides a noise signal indicating the presence or absence of an RF carrier signal. When an RF carrier signal appears, the coded voice detector 87 and the output from the noise or tone detector 10 are both coupled to the OR gate 89 to provide a third input to the AND gate 61 in order to unmute the speaker 6. The unmuting is accomplished by means of the mute control signal 40 (output of the AND gate 61) which enables the audio amplifier 4 subject to the other inputs to the AND gate 61.

The mute control signal 40 then enables the audio amplifier 4 after a particular time interval has passed depending on the status or command signal included in the information word recovered by the data decoder 17. After the time interval set by the programmable timer 66 (depending on the status or command word, sent by the transmitter of the received signal, specifying the type of signal following the data signal) has passed, voice communications can take place between the subscriber and another subscriber.

Figure 2A:
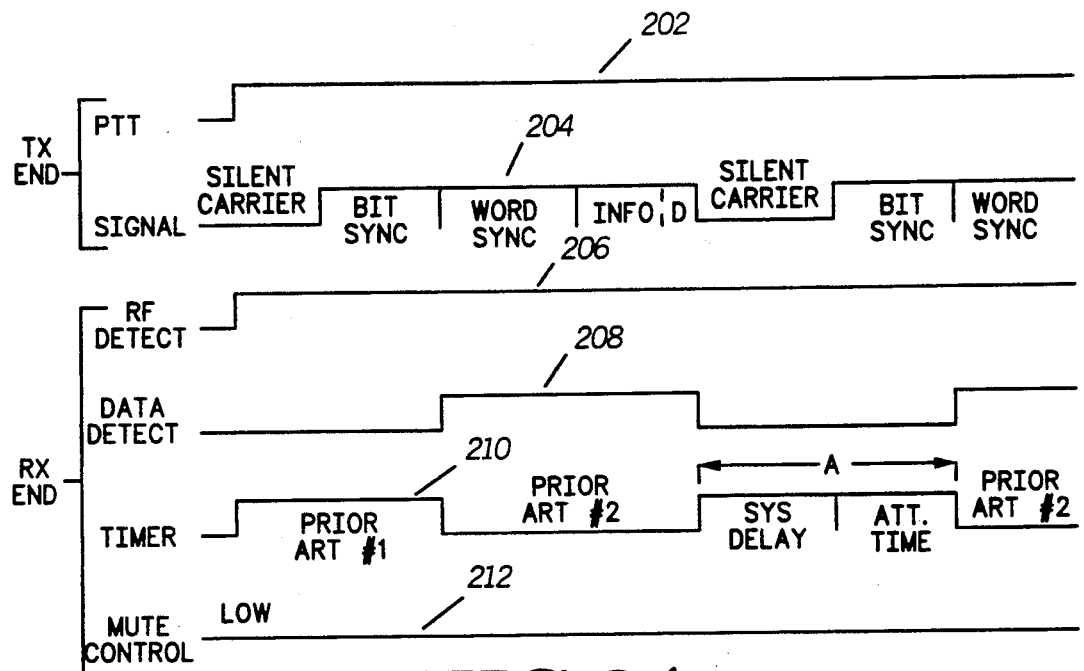
FIGS. 2A-C are timing diagrams for the signals from selected blocks in FIG. 1.
Figure 2B:
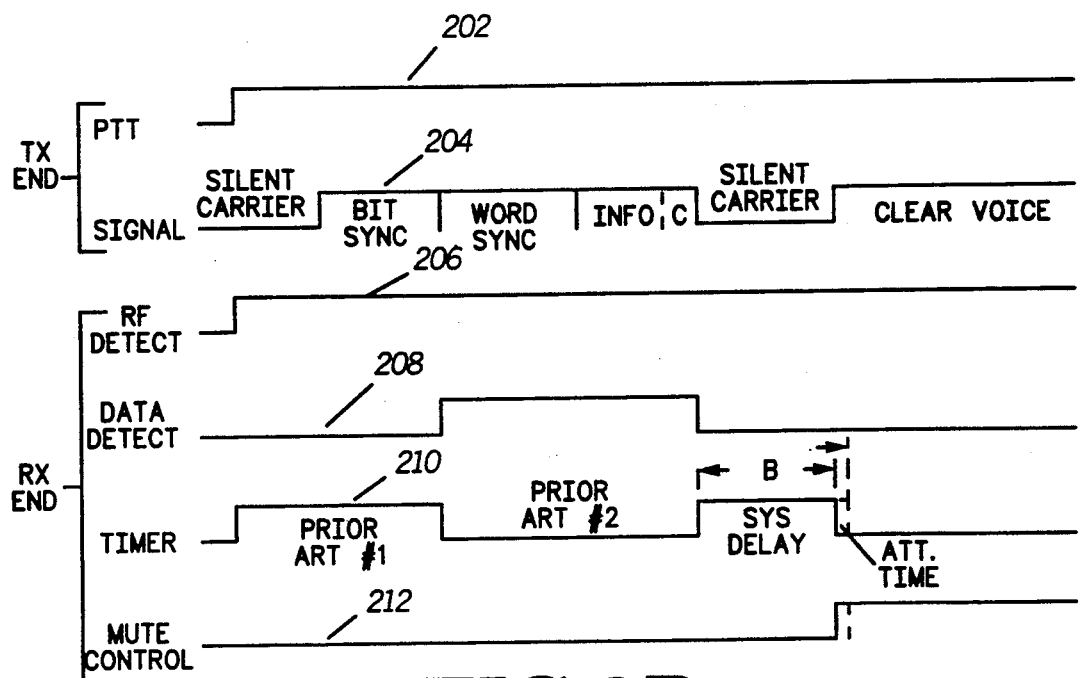
Figure 2C:
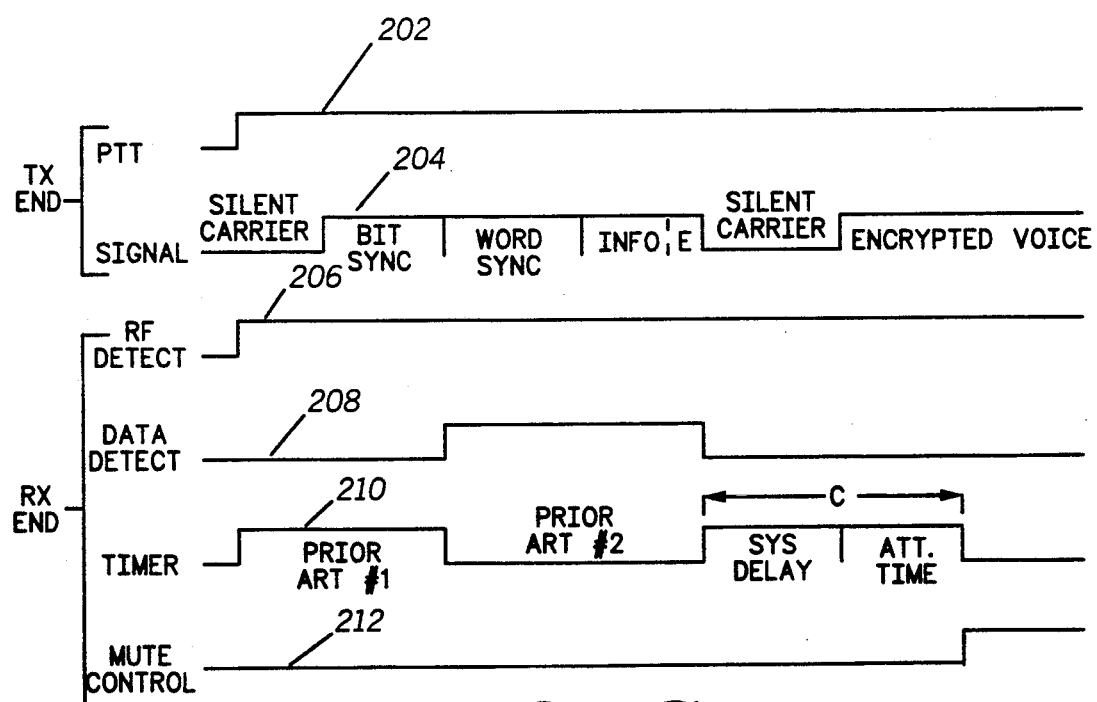

Referring to FIGS. 2A–C, operation of the subscriber units is depicted by waveforms where the transmit end waveforms 202 and 204 correspond to signals at a central station or a mobile or portable radio that is sending out or transmitting information. At the receiving end, wave forms 206, 208, 210 and 212 correspond to signals at the receiving mobile or portable radios. The noise or tone signal waveform 206 corresponds to the noise or tone detect signal from the noise or tone detector 10 in FIG. 1 and the mute control signal wave form 212 corresponds to the mute control signal 40 provided by the microcomputer 20 in FIG. 1. The data detect waveform 208 and timer waveform 210 correspond to internal timing signals of the microcomputer 20. Many different techniques exist for detecting the presence of the data signal such as detection of a word sync or in some improved methods, the detection of a bit sync as is illustrated by waveform 208 as an example. The present invention can work with any type of detection method.

The waveforms of FIGS. 2A–C illustrate an important feature of the present invention where the speaker muting is varied for a time duration sufficient to mute the attack time associated with a data signal, clear or coded voice signal along with a system delay time without muting any of the voice information. The system delay is the time difference between succeeding data or voice messages. The attack time is the delay from the reception of a signal to its detection. Hence, the timer waveform 210 and the mute control signal waveform 212 are varied according to the status or command field inside the information word of the data waveform 204, to change or not change states for unmuting the voice signal path. Thus, since muting is continued until the time specified by the command or status field inside the information word depending on the signal following the information word, the data muting apparatus of the present invention can accommodate data, clear voice and coded voice.

According to the present invention, as illustrated in FIG. 2A, based on the status or command field specifying "data" (D) included in the information word of the present data signal 204, the duration (system delay + attack time) of the programmable timer 66 controlling the mute control 40 is set for a time duration A. The duration A is calculated by adding the attack time of the data detector 15 to the system delay. In duration A, the system delay is defined as the time between data packets. Based on either a word sync or a bit sync detection algorithm, the time that the data detector 15 requires to detect the presence of the data signal in duration A is called the attack time. This duration A would then mute the speaker 6 to substantially avoid any data bursts associated with the following data signal.

In FIG. 2B, the duration of the programmable timer is set at the end of the information word for a duration B (covering both the system delay and attack time) starting and ending anytime between and including the end of the information word and the beginning of the following clear voice signal. There may be no or a slight attack time (as shown by the dashed lines) associated with detecting a clear voice signal. This duration B is based on the status or command field associated with the following clear voice signal (C) included in the information word of the signal 204.

In FIG. 2C, the duration of the programmable timer 66 is set for a duration C according to the status or command field associated with a coded or encrypted voice signal (E) of the signal 204. Duration C (covering both the system delay and attack time) starts from the end of the information word to sometime during the coded or encrypted voice signal which is sufficient to decrypt the following coded or encrypted voice signal. This duration C would then mute the speaker 6 to substantially avoid any data bursts associated with the following encrypted voice signal. In this manner, a listener is prevented from hearing the decryption of the coded voice signal.

In summary, an intelligent speaker muting method and apparatus has been described that eliminates the annoying data bursts caused by data signals and encrypted voice signals in communications systems which includes data, clear, and coded voice communications. The intelligent speaker muting method and apparatus mutes the signal received by a receiver for the duration determined by the status or command field inside the present data signal without muting the following audible voice signal. Since the speaker muting can be varied, the intelligent speaker muting method and apparatus of the present invention can accommodate variable time duration depending on whether the following signal is another data signal, a coded or a clear voice signal. The intelligent speaker muting method and apparatus can advantageously be used in radio or land line communication systems where both clear or coded voice signals and data signals are communicated between a central station and a plurality of remote stations.

What is claimed is:

1. A method for muting audio output of a first communication device by a second communication device, comprising the steps of:

in said second communication device:
transmitting a data signal and a subsequent signal having a signal type, in the same transmission, said data signal specifying the signal type of said subsequent signal, and said signal type of said subsequent signal having a specified mute time variable for setting a mute duration for said audio output; and in said first communication device:
receiving and detecting said data signal and said subsequent signal;
muting said audio output of said first communication device from the end of the time when said data signal is received, to the end of said mute duration, when said subsequent signal is detected, in response to said specified mute duration; and
unmuting the audio output of said first communication device after said specified mute duration, if said subsequent signal, is a voice type signal.

2. A communication system for muting audio output of a first communication device by a second communication device, comprising:

said second communication device comprising:
means for transmitting a data signal and a subsequent signal having a signal type, in the same transmission, said data signal specifying the signal type of said subsequent signal, and said signal type of said subsequent signal having a specified mute time variable for setting a mute duration for said audio output of said first communication device; and said first communication device comprising:
means for receiving and detecting said said data signal and said subsequent signal;
means for muting said audio output of said first communication device from the end of the time when said data signal is received, to the end of said mute duration, when said subsequent signal is detected, in response to said specified mute time variable,: and
means for unmuting the audio output of said first communication device, after said specified mute duration, if said subsequent signal is a voice type signal.

3. A radio comprising:
a receiver and detector for receiving and detecting transmissions including a data signal and a subsequent signal having a signal type, said data signal having an information word including an information field associated with the signal type of said subsequent signal, and said signal type of said subsequent signal having a specified mute time variable for setting a mute duration for an audio output of said radio:
decoding means for decoding said information field associated with said signal type of said subsequent signal;
muting means for muting the audio output of the radio for said specified mute duration, from the end of the time when said data signal is received, to the end of said mute duration, when said subsequent signal is detected, in response to said specified mute time variable; and means for unmuting the audio output of the radio, after said specified mute time variable, if said subsequent signal is a voice type signal.

4. The apparatus of claim 3 wherein said muting means includes means for muting the output of the receiver for at least a first time interval in response to said information field associated with a subsequent data signal having said specified mute time variable of said first time interval.

5. The apparatus of claim 4 wherein said muting means includes means for muting the output of the receiver for a second time interval in response to said information field associated with a subsequent voice signal having said specified mute time variable of said second time interval before unmuting a speaker of the receiver.

6. The apparatus of claim 5 wherein said muting means includes means for muting the output of the receiver for a third time interval in response to said information field associated with a subsequent coded voice signal having said specified mute time variable of said third time interval before unmuting said speaker of the receiver, wherein said third time interval is greater than said second time interval.

7. The apparatus of claim 3 wherein said muting means includes means for muting the output of the receiver for at least a first time interval in response to said information field associated with a following data signal, said first time interval including the time duration between data packets and an attack time to detect the identified presence of said following data signal, to substantially avoid a data burst associated with said following data signal.

8. The apparatus of claim 7 wherein said muting means includes means for muting the output of the receiver for a second time interval in response to said information field associated with a following coded voice signal, said second time interval including the time duration between signals and an attack time to decrypt said coded voice signal to avoid hearing the decryption of said coded voice signal.

9. The apparatus of claim 3 wherein said muting means includes means for muting the output of the receiver for said specified mute time variable, said specified mute time variable including a variable attack time associated with each type of said subsequent signals.

10. The apparatus of claim 3 wherein said decoding means includes means for decoding said information field specifying a first subsequent signal having a first mute time variable, a second subsequent signal having a second mute time variable, or a third subsequent signal having a third mute time variable.

11. The apparatus of claim 3 wherein said decoding means includes means for decoding said information field specifying a selected duration for said specified mute time variable.

12. A radio for controlling a speaker mute time in a receiving radio, comprising:
transmitter means for transmitting a first signal and a second signal in the same transmission; and
means for generating the first signal having a digital word specifying whether the second signal is a data signal having a first attack time, an uncoded voice signal having a second attack time, or a coded voice signal having substantially no attack time, the attack time being a mute time variable needed to mute the receiving radio while the receiving radio is detecting an identified presence of the second signal and unmuting the receiving radio, after said specified attack time, if said second signal is said uncoded voice signal or said coded voice signal.

* * * * *